United States Patent
Miyamoto et al.

(10) Patent No.: US 6,654,303 B2
(45) Date of Patent: Nov. 25, 2003

(54) SEMICONDUCTOR MEMORY DEVICE, METHOD FOR CONTROLLING SAME, AND ELECTRONIC INFORMATION APPARATUS

(75) Inventors: Yasuo Miyamoto, Tenri (JP); Hidekazu Takata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/167,806

(22) Filed: Jun. 11, 2002

(65) Prior Publication Data

US 2003/0007407 A1 Jan. 9, 2003

(30) Foreign Application Priority Data

Jun. 15, 2001 (JP) ........................................ 2001-182452

(51) Int. Cl.$^7$ ............................................... G11C 7/00
(52) U.S. Cl. ..................... 365/222; 365/195; 365/233; 365/230.03
(58) Field of Search ...................... 365/222, 230.03, 365/233, 194, 195

(56) References Cited

U.S. PATENT DOCUMENTS 4,953,131 A  *  8/1990 Purdham et al. ............ 365/222
5,867,446 A  *  2/1999 Konishi et al. ............. 365/233

FOREIGN PATENT DOCUMENTS

JP         07-161184         6/1995

* cited by examiner

*Primary Examiner*—Hoai Ho
*Assistant Examiner*—Gene N. Auduong
(74) *Attorney, Agent, or Firm*—Morrison & Foerster LLP (57) ABSTRACT

A semiconductor memory device of the present invention includes: a time measurement section for measuring a critical amount of time for the memory cells to hold data; a plurality of memory circuits each storing refresh information which indicates that a corresponding memory bank is refreshed; a refresh address designation section for designating a refresh address in the corresponding memory bank; and a refresh control section for controlling the refresh operation with respect to each of the memory banks according to the designated refresh address and determining an unrefreshed memory bank based on the refresh information so as to perform the refresh operation with respect to the determined unrefreshed memory bank.

17 Claims, 7 Drawing Sheets

SEMICONDUCTOR MEMORY DEVICE, METHOD FOR CONTROLLING SAME, AND ELECTRONIC INFORMATION APPARATUS

BACKGROUND OF THE INVENTION

1. Field of the Invention

The present invention relates to a semiconductor memory device, such as a DRAM or PSRAM (pseudo static RAM), which has a refresh control function, a method for controlling such a semiconductor memory device and an electronic information apparatus including the same semiconductor memory device.

2. Description of the Related Art

Conventionally, a DRAM/PSRAM requires a refresh operation for holding data therein. In the DRAM/PSRAM, a prescribed period of time is set so as to perform the refresh operation while inhibiting a CPU (central processing unit) from accessing the DRAM/PSRAM during the prescribed period of time.

However, for a system which is required to have fast processing ability, it is a great waste of time to set such a time period so as to inhibit the CPU from accessing memory, such as DRAM or PSRAM. In order to avoid such a great waste of time, for example, a "memory control device" disclosed in Japanese Laid-Open Patent Publication No. 7-161184 has been suggested. A control method used in this memory control device is described with reference to FIG. 6.

Figure 6:
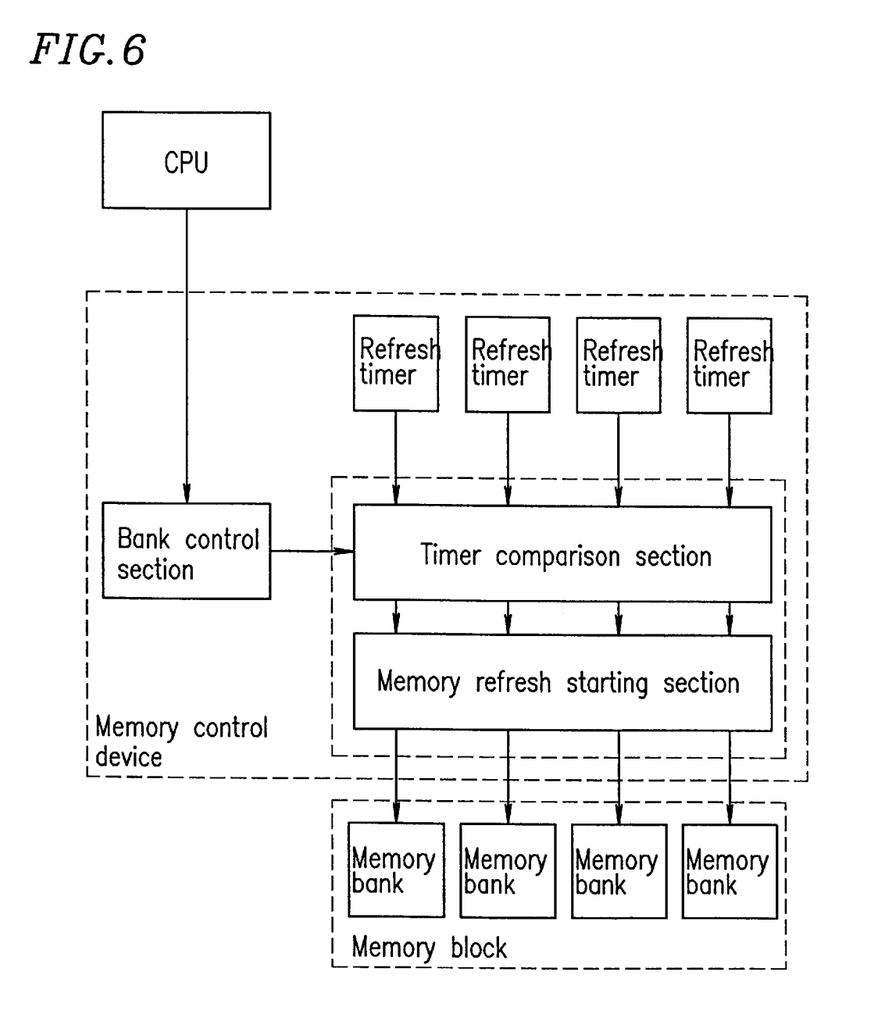
FIG. 6 is a block diagram showing a primary structure of a conventional semiconductor memory device.

FIG. 6 is a block diagram showing a primary structure of a conventional semiconductor memory device including a conventional memory control device as disclosed in Japanese Laid-Open Patent Publication No. 7-161184. In FIG. 6, a memory block is divided into a plurality of memory banks which are not accessed simultaneously. The conventional memory control device includes refresh timers each corresponding to a respective one of the plurality of memory banks. Each refresh timer measures a period of time elapsed since a corresponding memory bank was refreshed. The conventional memory control device also includes a timer comparison section for comparing respective values of the refresh timers so as to determine a memory bank, which has not been refreshed for the longest period of time, among all the memory banks.

When a read/write access operation is performed with respect to the memory bank due to an external control signal (not shown), a refresh operation is performed simultaneously with the read/write cycle on one of the memory banks other than the memory bank, which is targeted for the read/write access operation, corresponding to the refresh timer having a greatest value, i.e., the memory bank which has not been refreshed for the longest period of time among all the memory banks other than the target memory bank.

When only the same memory bank is continuously accessed so that the same memory bank cannot be refreshed during a period of time for data to be held by the same memory bank, the conventional memory control device outputs a timeout signal to the same memory bank so as to inhibit the same memory bank from being accessed and to refresh the same memory bank.

Therefore, a refresh operation can be concealed so as not to be apparent to any external device when continuous accesses are not performed with respect to the same memory bank.

However, since the DRAM/PSRAM are random access memories, only the same memory bank can be continuously accessed. As described above, in the structure of the conventional memory control device, when the same memory bank is continuously accessed, the conventional memory control device outputs a timeout signal so as to inhibit the same memory bank from being accessed, and therefore the refresh operation can be performed on the same memory bank. However, if the conventional memory control device frequently outputs the timeout signal (so as to perform the refresh operation), a period of time occurs for which the same memory bank is continuously inhibited from being accessed, and therefore there is no sense in employing the conventional control method as described above.

In order to reduce the frequency of outputting the timeout signal, a possibility that only the same memory bank is accessed must be decreased. One method applicable to this end is to subdivide the memory block so as to increase the division number of the memory block (i.e., the number of memory banks).

However, as described above, in the conventional control method used in conjunction with the "memory control device" disclosed in the Japanese Laid-Open Patent Publication No. 7-161184, the memory control device is required to include the refresh timers each corresponding to a respective one of the memory banks. Each refresh timer measures a critical amount of time for a memory cell to hold data. Although a size of each refresh timer is not considerably large, a size of a circuit, which includes a plurality of refresh timers according to the number of memory banks, becomes large. Further, since the timer comparison section is required to compare values of all the refresh timers, when the number of memory banks is increased, the timer comparison section becomes complex and large.

On the other hand, since the number of memory banks cannot be increased, a size of each memory bank is increased. That is, a region to be activated for each access is increased in the memory bank, thereby causing an increase in consumption current. Further, whenever a read/write access operation is performed with respect to the memory bank due to the external control signal, a refresh operation is performed on another memory bank. Accordingly, two memory banks are always activated simultaneously. Since these two memory banks are simultaneously activated, the refresh operation is concealed so as not to be apparent to any external device, i.e., the memory access and the refresh operation are simultaneously performed in parallel. However, when the memory bank is sequentially requested to be read/written every 100 nanoseconds, the refresh operation is also performed every 100 nanoseconds while it is enough to perform the refresh operation with a frequency between several microseconds and several tens of microseconds. As a result, consumption current is increased by the unnecessary refresh operations.

SUMMARY OF THE INVENTION

According to one aspect of the present invention, there is provided a semiconductor memory device which includes: a memory block including a plurality of memory cells each including a transistor and a capacitor and storing information based on the presence of charges in the capacitor, the charges in the capacitor being held by a refresh operation, the memory block being divided into a plurality of memory banks such that the number of the memory banks is greater than a usually-prescribed number and the plurality of memory banks are not simultaneously accessed, the plurality of memory banks individually receiving access and refresh operations with respect to the memory cells; a time measurement section for measuring a critical amount of time for the memory cells to hold data; a plurality of memory circuits each storing refresh information which indicates that a corresponding memory bank is refreshed; a refresh address designation section for designating a refresh address in the corresponding memory bank; and a refresh control section for controlling the refresh operation with respect to each of the memory banks according to the designated refresh address and determining an unrefreshed memory bank based on the refresh information so as to perform the refresh operation with respect to the determined unrefreshed memory bank.

In one embodiment of this invention, the semiconductor memory device further includes a plurality of adjustment sections provided so as to respectively correspond to the memory banks and select any one of the refresh address and a normal access address based on a control signal from the refresh control section.

In one embodiment of this invention, the refresh control section controls an operation of the semiconductor memory device so as to inhibit access to a normal access address and prioritize the refresh operation with respect to the memory bank which is not refreshed within the critical amount of time for the memory cells to hold data.

In one embodiment of this invention, when normal access is performed with respect to the memory bank at a normal access address, the refresh control section controls the operation of the semiconductor memory device so as to simultaneously perform the refresh operation at the refresh address with respect to the plurality of memory banks except for the memory bank normally accessed at the normal access address.

According to another aspect of the present invention, there is provided a method for controlling a semiconductor memory device which includes the steps of: when normal access for a read/write operation is performed with respect to a memory bank in the semiconductor memory device due to an external control signal, checking refresh information stored in all memory circuits corresponding to their respective memory banks other than the memory circuit corresponding to the accessed memory bank so as to determine whether or not there is any unrefreshed memory banks other than for the accessed memory bank; when an unrefreshed memory bank is determined to be present based on the refresh information, refreshing the unrefreshed memory bank simultaneously with the normal access for a read/write operation to the other memory bank and storing refresh information which indicates that the unrefreshed memory bank has been refreshed; when a time measurement section outputs a timeout signal which indicates that a critical amount of time for memory cells to hold data has elapsed, checking the refresh information stored in the memory circuits corresponding to all the memory banks so as to determine whether or not all the memory banks have been refreshed; when an unrefreshed memory bank is determined to be present, refreshing the unrefreshed memory bank and storing the refresh information which indicates that the unrefreshed memory bank has been refreshed in the memory circuit corresponding to the unrefreshed memory bank; checking the refresh information stored in the memory circuits corresponding to all the memory banks once again so as to determine whether or not there is any memory bank which is left unrefreshed; when an unrefreshed memory bank is determined to be present based on the refresh information, refreshing the unrefreshed memory bank; repeating the checking and refresh operations until all the memory banks are refreshed; and incrementing a refresh address designation section for designating a refresh address at the time of performing the refresh operation after all the memory banks have been refreshed, wherein when all the memory banks have been refreshed before outputting the timeout signal, the refresh address designation section is incremented immediately after outputting the timeout signal.

In one embodiment of this invention, when normal access for a read/write operation is performed with respect to the memory bank in the semiconductor memory device due to the external control signal and/or when the timeout signal is output, the refresh operation is performed with respect to groups of the plurality of memory banks each group consisting of two or more memory banks.

In one embodiment of this invention, after the timeout signal is output, the refresh operation is performed with respect to an unrefreshed memory bank while inhibiting an access of the external control signal to the memory banks.

In one embodiment of this invention, in the memory bank targeted for normal access for a read/write operation due to the application of the external control signal, when a row address part obtained by decoding an address of a memory cell receiving the normal access is identical to a row address output by the refresh address designation section, the refresh information, which indicates that the memory bank targeted for the normal access has been refreshed, is stored in the memory circuit corresponding to the memory bank targeted for the normal access.

According to still another aspect of the present invention, there is provided an electronic information apparatus including the semiconductor memory device for processing information while performing memory and refresh operations.

Effects of the above-described structure will be described below. According to the present invention, the number of the plurality of memory banks is greater than the number of the memory banks used in the conventional control method, i.e., the number of the plurality of memory banks is greater than the number of the memory banks usually used, so as not to be simultaneously accessed. However, unlike the conventional control method, a plurality of refresh timers corresponding to the number of divided memory banks and the timer comparison section for comparing values of the refresh timers are not included in the semiconductor memory device of the present invention. Instead of including the plurality of refresh timers and the timer comparison section, the semiconductor memory device includes a single refresh timer and small-scale circuits, such as memory circuits each having a size of substantially one bit and storing information which indicates whether or not a corresponding memory bank is refreshed and adjustment circuits for refresh address and normal access (read/write operations due to an externally-input control signal). Therefore, even when the memory block is divided into a plurality of memory banks, there is no adverse effect as associated with the conventional control method, which includes a considerable increase in size of an internal circuit due to a plurality of refresh timers, and a considerable increase in size and complexity of the timer comparison section. Further, a size of the internal circuit of the semiconductor memory device is reduced as compared to the conventional memory control device, so that an entire size of the semiconductor memory device is not increased. Therefore, it is possible to easily divide the memory block into a number of memory banks, considerably reduce the frequency of outputting the timeout signal from the refresh timer to the refresh control circuit, and reduce consumption current required for the refresh operation without increasing an entire size of the semiconductor memory device.

Further, the semiconductor memory device according to the present invention includes the memory circuits corresponding to the respective memory banks which store historical information which indicates whether or not the corresponding memory banks have been refreshed. Therefore, even if the reading/writing access is frequently requested with respect to any one of the memory banks, the memory banks which have been already refreshed are not refreshed again as conventionally required, and therefore unnecessary refresh operations are avoided. This leads to further reduction in consumption current for the refresh operation.

Thus, the invention described herein makes possible the advantages of providing: (1) a semiconductor memory device which can reduce the frequency of outputting a timeout signal for inhibiting a memory access and performing a refresh operation and can reduce consumption current required for the refresh operation without increasing a size of an internal circuit; (2) a method for controlling such a semiconductor memory device; and (3) an electronic information apparatus including the same semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, semiconductor devices and a method for controlling the same semiconductor device according to examples of the present invention will be described with reference to the drawings.

Figure 1:
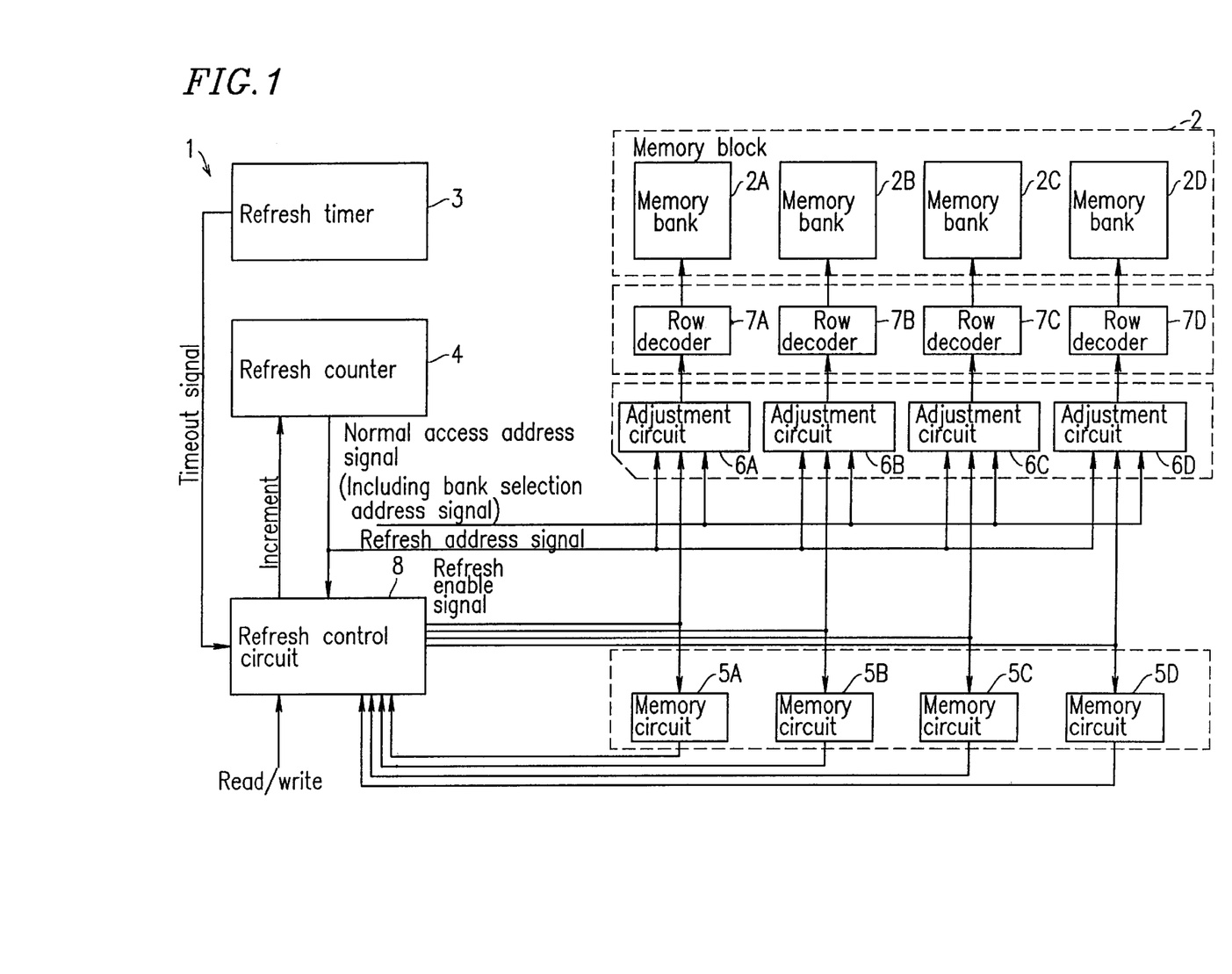
FIG. 1 is a block diagram showing a primary structure of a semiconductor memory device according to an example of the present invention.

FIG. 1 is a block diagram showing a primary structure of a semiconductor memory device 1 according to one example of the present invention. In FIG. 1, the semiconductor memory device 1 includes a memory block 2, a refresh timer 3 used as a time measurement section which measures maximum memory time, a refresh counter 4 used as a refresh address designation section, memory circuits 5A–5D each used as a refresh information storage section, adjustment circuits 6A–6D each used as an address switch (adjustment) section, row decoders 7A–7D each used as a row selection signal transformation section, and a refresh control circuit 8 used as a refresh control section.

The memory block 2 is divided into a plurality of memory banks 2A–2D which are not accessed simultaneously. The number of the plurality of memory banks 2 divided in the memory block 2 is greater than the number of memory banks used in conjunction with a conventional control method, i.e., greater than the number of memory banks normally divided in one memory block, so as to reduce a frequency of outputting a timeout signal by reducing a possibility that only the same memory bank is accessed.

The refresh timer 3 measures a period of time for a refresh operation to be completed at a designated address, i.e., a critical amount of time for a memory cell to hold data, and outputs the timeout signal to the refresh control circuit 8 when the period of time for a refresh operation to be completed lapses.

The refresh counter 4 designates an address of the memory cell to be refreshed in the memory bank.

The memory circuits 5A–5D correspond to their respective memory banks 2A–2D and store refresh information which indicates that their respective corresponding memory bank 2A–2D is refreshed.

The adjustment circuits 6A–6D correspond to their respective memory banks 2A–2D and select either one of a normal access address signal created based on a read/write address signal externally input to the semiconductor memory device 1 and a refresh address signal representing an address designated by the refresh counter 4 according to a refresh enable signal output by the refresh control circuit 8.

The row decoders 7A–7D correspond to their respective memory banks 2A–2D and decode selection address signals provided by their respective adjustment circuits 6A–6D so as to create a row selection signal for selecting a row (e.g., a bit line) corresponding to an address provided to one of memory cells arranged in a matrix form along row and column directions (for example, word line and bit line arrangement directions) in the corresponding memory banks 2A–2D for selecting a row in the memory banks 2A–2D so as to perform a normal access or a refresh operation with respect to the selected row.

The refresh control circuit 8 controls the refresh operation according to the present invention and determines, in response to a read/write signal input from an external device or the timeout signal from the refresh timer 3, whether or not the refresh operation is required to be performed on any one of the memory banks 2A–2D based on refresh information stored in a corresponding one of the memory circuits 6A–6D so as to create a refresh enable signal.

Specific examples of refresh operations including the operation of the refresh control circuit 8 are described below. Such examples are described in detail with respect to cases where the refresh operation has been completed with respect to all the memory banks when the timeout signal is output (FIG. 2), the refresh operation has not been completed with respect to all the memory banks when the timeout signal is output (FIG. 3), and two different memory banks other than the memory bank on which a normal access operation is performed are simultaneously refreshed (FIG. 4).

Figure 2:
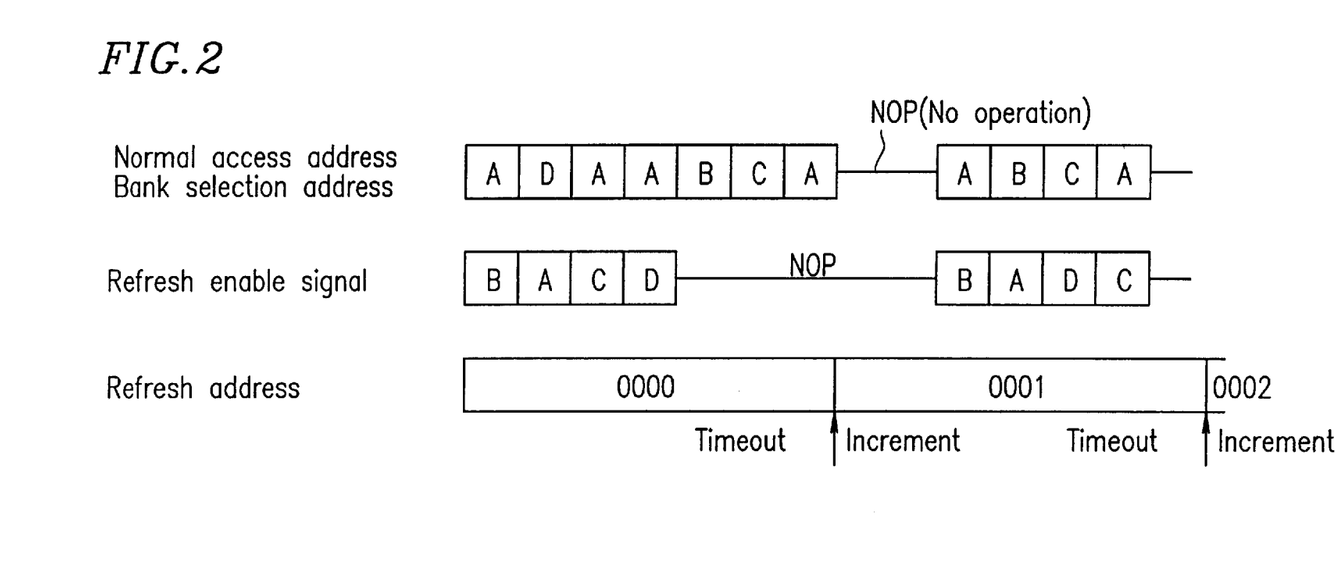
FIG. 2 is a timing chart showing a refresh operation of the semiconductor memory device shown in FIG. 1 with respect to a case where all memory banks have been refreshed when a timeout signal is output by a refresh timer.

FIG. 2 is a timing chart for explaining refresh operations of the semiconductor memory device 1 shown in FIG. 1 with respect to a case where all the memory banks have been refreshed when the timeout signal is output.

In FIG. 2, the refresh counter 4 of FIG. 1 indicates that the refresh address of the memory cells to be refreshed in each of the memory banks 2A–2D is initially "0000H", where "H" denotes that the numerical value is represented by a sexadecimal number. When normal access is performed with respect to the memory bank 2A due to the application of the external control signal, the memory cells at the refresh address "0000H" of the memory bank 2B are refreshed simultaneously with the normal access and the memory circuit 5B corresponding to the memory bank 2B is caused to store refresh information which indicates that the refresh operation has been completed with respect to the memory bank 2B.

Next, when the normal access is performed with respect to the memory bank 2D, the memory cells at the refresh address "0000H" of the memory bank 2A are refreshed simultaneously with the normal access and the memory circuit 5A corresponding to the memory bank 2A is caused to store refresh information which indicates that the refresh operation has been completed with respect to the memory bank 2A. In a similar manner, when normal access is performed with respect to the memory bank 2A, the memory cells at the refresh address "0000H" of the memory bank 2C are refreshed and the memory circuit 5C corresponding to the memory bank 2C is caused to store refresh information which indicates that the refresh operation has been completed with respect to the memory bank 2C. When normal access is performed again with respect to the same memory bank 2A, the memory cells at the refresh address "0000H" of the memory bank 2D, which is the last unrefreshed memory bank, except for the memory bank 2A, is refreshed, and the memory circuit 5D corresponding to the memory bank 2D is caused to store refresh information which indicates that the refresh operation has been completed with respect to the memory bank 2D.

Now, the memory cells at refresh memory address "0000H" of all the memory banks 2A–2D have been refreshed. Next, the memory banks 2B, 2C and 2A are normally accessed in this order. However, all the memory banks 2A–2D have already been refreshed and all the corresponding memory circuits 5A–5D have stored refresh information which indicates the completion of the refresh operations, and therefore no refresh operation is performed simultaneously with any normal access until the refresh timer 3 outputs the timeout signal. Thereafter, even when the timeout signal is output by the refresh timer 3, the refresh operations for the refresh address "0000H" of all the memory banks 2A–2D are completed, and therefore the following operations are performed.

At the same time as receiving the timeout signal from the refresh timer 3, the refresh control circuit 8 outputs a signal for incrementing the refresh counter 4 so as to set the next refresh address to "0001H". While the refresh address remains at "0001H" (i.e., until the next timeout signal is output), the refresh operations are performed with respect to the memory cells at the refresh address "0001H" of all the memory banks 2A–2D.

In this manner, in the operations related to FIG. 2, the refresh operations are completed with respect to all the memory banks 2A–2D before the timeout signal for the refresh address "0001H" is output. Therefore, as in the case where the refresh counter 4 is incremented from "0000H" to "0001H", the refresh counter 4 is incremented to the following refresh address "0002H" simultaneously with the output of the timeout signal. This procedure is sequentially repeated with respect to all the refresh addresses ranging from "0000H" to "FFFFH" so as to refresh all the memory cells in the memory block 2. Since the refresh operation is simultaneously performed in parallel to the normal read/write access, the refresh operation is concealed so as not to be apparent to any external devices.

Figure 3:
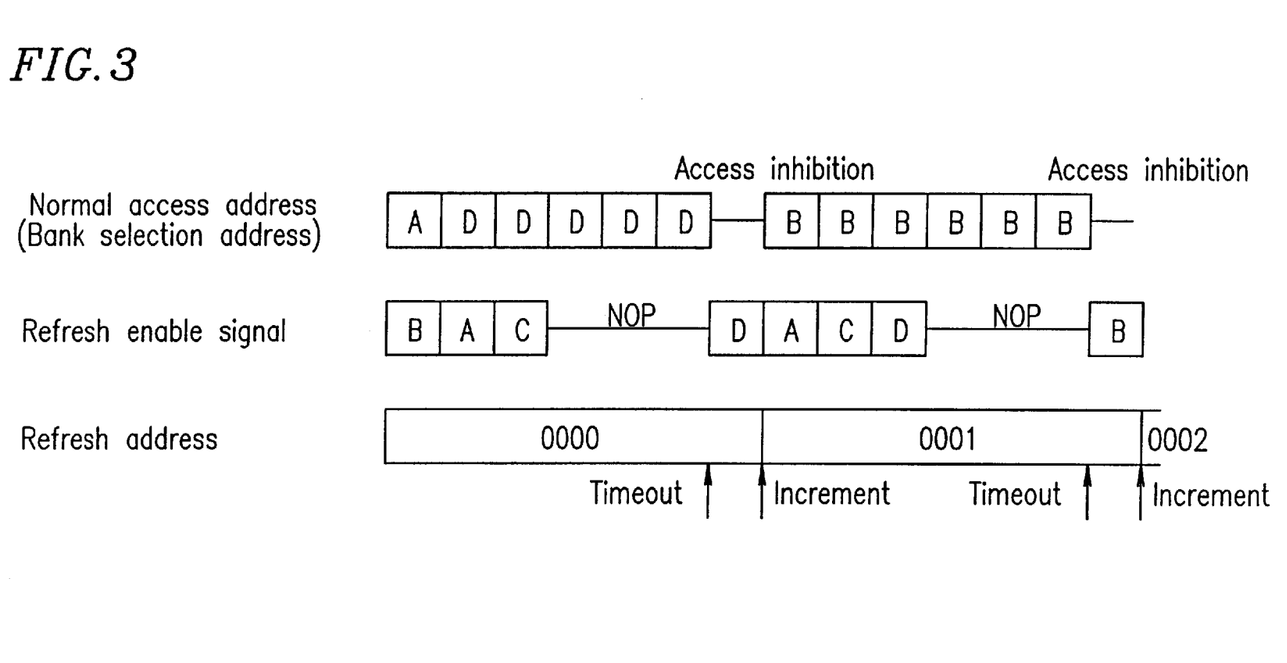
FIG. 3 is a timing chart for explaining refresh operations of the semiconductor memory device shown in FIG. 1 with respect to a case where all memory banks have not been refreshed when the timeout signal is output by the refresh timer.
Figure 4:
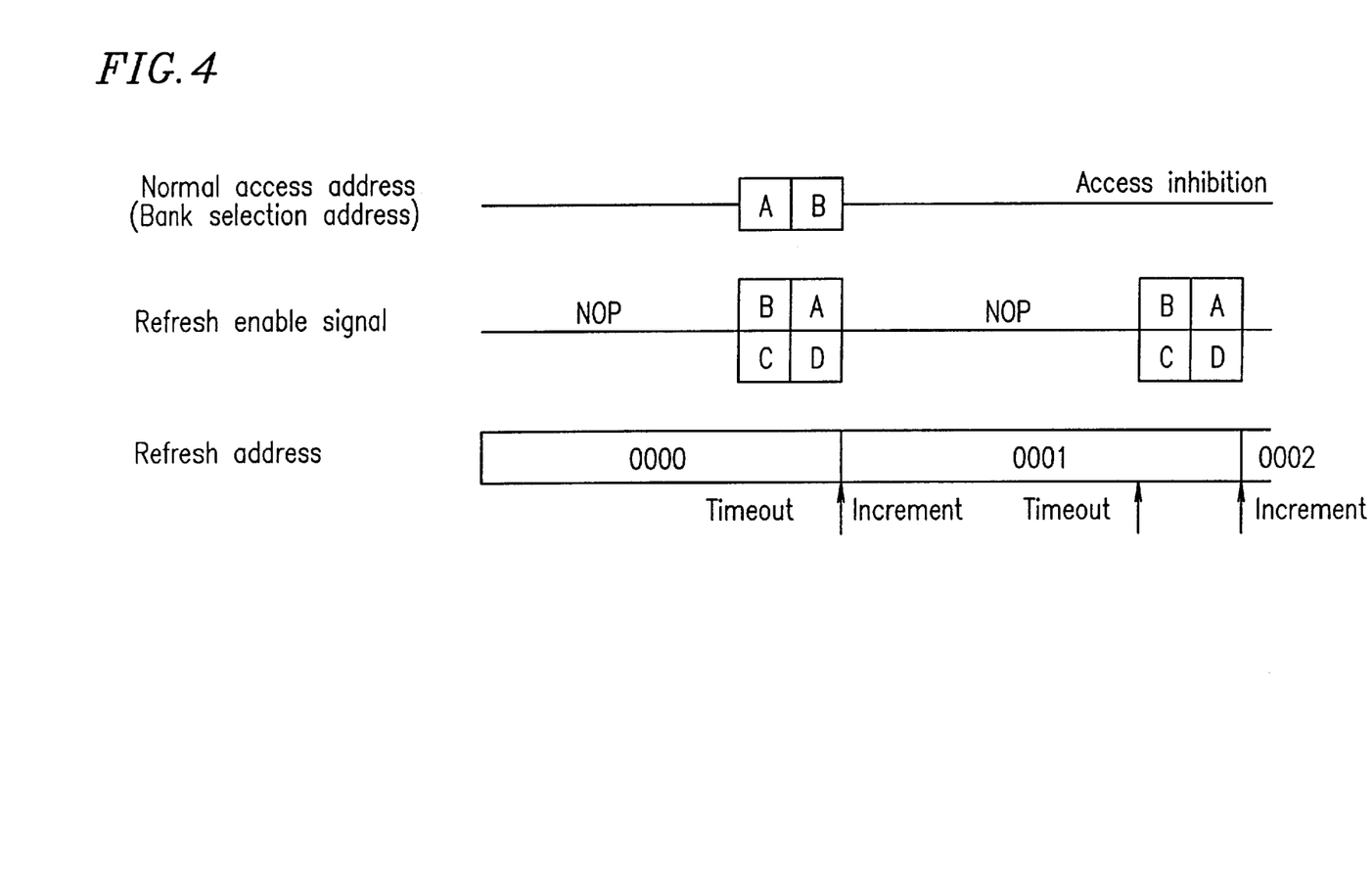
FIG. 4 is a timing chart for explaining refresh operations of the semiconductor memory device shown in FIG. 1 with respect to a case where the refresh operation is performed simultaneously with a normal memory access but a memory block is maintained in a standby state so that the normal memory access does not occur.

FIG. 3 is a timing chart for explaining refresh operations of the semiconductor memory device 1 shown in FIG. 1 with respect to a case where all the memory banks have not been refreshed when the timeout signal is output.

In FIG. 3, the time counter 4 of FIG. 1 indicates that the refresh address of the memory cells to be refreshed in each of the memory banks 2A–2D is initially "0000H". When normal access is performed with respect to the memory bank 2A due to the application of the external control signal (a read/write signal), the memory cells at the refresh address "0000H" of the memory bank 2B are refreshed simultaneously with the normal access and the memory circuit 5B corresponding to the memory bank 2B is caused to store refresh information which indicates that the refresh operation has been completed with respect to the memory bank 2B.

Next, when the normal access is performed with respect to the memory bank 2D, the memory cells at the refresh address "0000H" of the memory bank 2A are refreshed simultaneously with the normal access and the memory circuit 5A corresponding to the memory bank 2A is caused to store refresh information which indicates that the refresh operation has been completed with respect to the memory bank 2A. When normal access is performed again with respect to the same memory bank 2D, the memory cells at the refresh address "0000H" of the memory bank 2C are refreshed and the memory circuit 5C corresponding to the memory bank 2C is caused to store refresh information which indicates that the refresh operation has been completed with respect to the memory bank 2C. Even if normal access is performed once again with respect to the same memory bank 2D, the refresh operation has already been completed with respect to all the memory banks 2A–2C other than the memory bank 2D, and therefore the refresh operation is not performed with respect to the memory banks 2A–2C as well as the memory bank 2D.

Thereafter, when normal access is performed with respect to any one of the memory banks 2A–2C other than the memory bank 2D before the timeout signal is output to the refresh control circuit 8 by the refresh timer 3, the memory bank 2D is refreshed. However, in the operation in FIG. 3, normal access is continuously performed with respect to the memory bank 2D, and therefore the memory bank 2D is not refreshed so as to avoid the refresh operation from being performed simultaneously with the normal access thereto.

Therefore, when receiving the timeout signal from the refresh timer 3, the refresh control circuit 8 controls the operation of the semiconductor memory device 1 so as to refresh the memory cells at the refresh address "0000H" of the memory bank 2D. While the refresh operation is performed with respect to the memory bank 2D, normal access is inhibited from being performed with respect to the memory bank 2D.

Thereafter, the refresh operation is completed with respect to the memory bank 2D, so that all the memory cells at the refresh address "0000H" of all the memory banks 2A–2D are refreshed. At this point, the refresh counter 4 is incremented so that the next refresh address is set to "0001H".

In the operations related to FIG. 3, when the refresh address is "0001H", the memory bank 2B is not yet refreshed before the timeout signal is output, and therefore after the timeout, the refresh control circuit 8 controls the operation of the semiconductor memory device 1 so as to refresh the memory bank 2B. At this point, normal access for reading/writing data from/to the memory bank 2B is inhibited.

In this case, although the normal access for reading/writing data from/to the memory bank 2B is naturally inhibited while the refresh operation is performed with respect to the memory bank 2B, normal access for reading/writing can be performed with respect to any one of the memory banks 2A, 2C and 2D but not for the memory bank 2B.

It should be noted that when it is difficult to output an access inhibition signal to the individual memory banks 2A–2D in the multi-divided memory banks 2A–2D, all the memory banks 2A–2D can be simultaneously inhibited from being accessed.

Further, in order to facilitate the control for inhibiting the normal access, each of the memory banks 2A–2D can be divided into two groups such that each group is individually controlled so as to inhibit normal access thereto. Alternatively, each of the memory banks 2A–2D can be divided into three or more groups.

When the above-described refresh operation is completed with respect to the memory bank 2B, all the memory cells at the refresh address "0001H" of all the memory banks 2A–2D are refreshed. At this point, the refresh counter 4 is incremented so as to set the next refresh address to "0002H". Similar to the refresh operation described above, all the memory cells at the refresh address "0002H" of all the memory banks 2A–2D are refreshed. This procedure is sequentially repeated with respect to all the refresh addresses ranging from "0000H" to "FFFFH" so as to refresh all the memory cells in the memory block 2.

Although FIG. 3 shows an example of the case where all the memory banks 2A–2D cannot be refreshed by the time the timeout signal is output, as described above with respect to the conventional problems, by dividing the memory block 2 into as many memory banks as possible, it is possible to reduce the possibility of the case described with reference to FIG. 3.

Unlike the conventional method described above, a single refresh timer 3 controls the refresh operation with respect to all the memory banks 2A–2D, and therefore the present invention has an advantage in that a size and consumption power of the internal circuit of the semiconductor memory device 1 are not increased according to an increase in the number of memory banks. Further, according to the control method of the present invention, the conventional timer comparison section, such as the timer comparison section shown in FIG. 6, is not required for comparing values of the refresh timer 3, and therefore the memory block 2 can be easily divided into a greater number of memory banks, such as the memory banks 2A–2D, as compared to the conventional control method. By dividing the memory block 2 into the greater number of memory banks, it is possible to reduce the possibility that only the same memory bank is continuously accessed and to reduce the frequency of outputting the timeout signal. Also, the consumption current required for the refresh operation can be reduced.

Although in the example described with reference to FIG. 3 the same memory bank is continuously accessed so that the refresh operation reaches the timeout while leaving one memory bank unrefreshed, in the following example which is described with reference to FIG. 4, the refresh operation is performed simultaneously in parallel with normal access for reading/writing, and therefore the refresh operation is not performed with respect to all the memory banks 2A–2D in a case where the memory block 2 is maintained in a standby state so that normal memory access does not occur.

In the example of FIG. 4, in the case where the memory cells are intended to be frequently accessed, by dividing the memory block 2 into a greater number of memory banks as compared to the conventional control method, it is possible to shorten a period of time which is required during the refresh operation for inhibiting each memory bank from being accessed. However, when the memory block 2 is not accessed, i.e., the memory block 2 is maintained in a standby state, all the memory banks which are left unrefreshed are required to be refreshed one by one after a final timeout signal is output, and therefore in the case where the number of memory banks divided in the memory block 2 is increased, once the refresh operation is started, an access inhibition period for which the following access cannot be accepted lasts for a long time as compared to a case where the number of the memory banks is less. This problem is solved by simultaneously refreshing a plurality of memory banks. This shortens the access inhibition period caused by the refresh operation after the timeout.

In the example of FIG. 4, two memory banks are simultaneously refreshed. In this case, after the refresh operation reaches the timeout, when the following timeout occurs before the normal access is performed, the memory banks 2A or 2B are simultaneously refreshed together with the memory banks 2C or 2D. When normal access is performed with respect to the memory bank 2A, two memory banks 2B and 2C are refreshed in parallel to the normal access to the memory bank 2A. When normal access is performed with respect to the memory bank 2B, the two memory banks 2A and 2D are refreshed in parallel to the normal access to the memory bank 2B.

That is, a plurality of memory banks are refreshed in parallel to a single normal access operation. In this method, the number of memory banks to be refreshed is increased even if the frequency of occurrence of the normal access is low, and therefore unrefreshed memory banks can be refreshed in a short period of time after the timeout. It should be noted that although two memory banks are simultaneously refreshed in this example, three or more memory banks can be simultaneously refreshed in accordance with the present invention.

Figure 5:
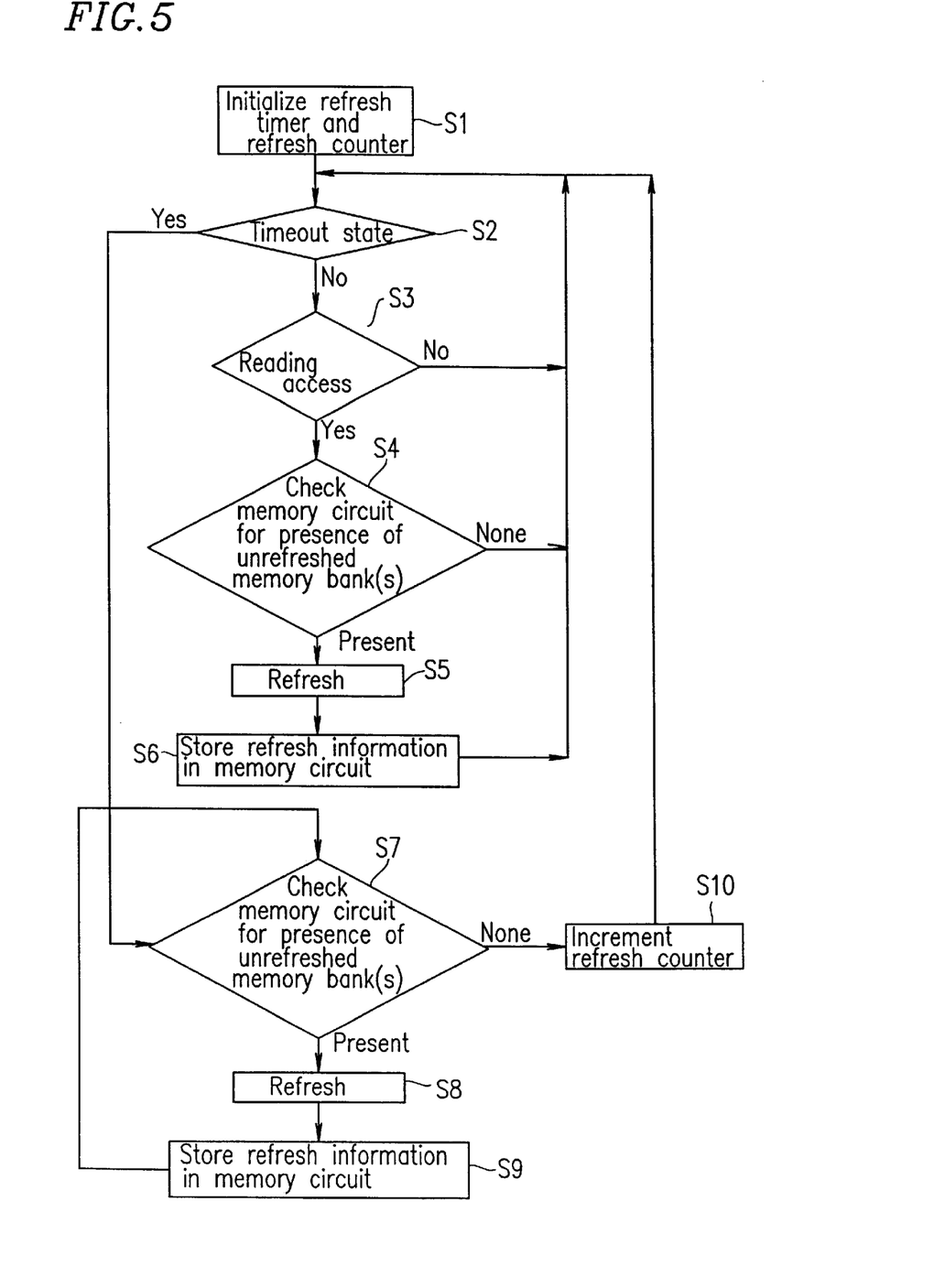
FIG. 5 is a flow chart showing a refresh operation in the semiconductor memory device of FIG. 1.

FIG. 5 is a flow chart showing a refresh operation in the semiconductor memory device 1 of FIG. 1. In FIG. 5, firstly, the refresh timer 3 and refresh counter 4 are initialized (step S1).

Then, the refresh control circuit 8 determines whether or not the refresh operation is in a timeout state based on the presence of the timeout signal input from the refresh timer 3 (step S2).

When the refresh operation is not determined to be in the timeout state at step S2, the refresh control circuit 8 determines whether or not there is a normal access for a normal reading/writing operation from the outside of the memory block 2 (step S3).

When the normal access for the normal reading/writing operation is determined at step S3 as being performed, the refresh control circuit 8 checks refresh information in the memory circuits 5A–5D so as to determine whether or not there is any of the memory banks which is/are left unrefreshed except for that receiving the normal access (step S4).

When any unrefreshed memory bank or banks is/are determined to be present at step S4, the refresh control circuit 8 controls the operation so as to cause the refresh operation to be simultaneously performed with respect to the unrefreshed memory bank(s) in parallel to the reading/writing access to the other memory bank (step S5) so as to cause any one of the memory circuits 5A–5D corresponding to the memory bank(s) receiving the refresh operation to store refresh information which indicates that the memory bank has been refreshed (step S6). This procedure is repeated until the refresh operation reaches the timeout.

Next, when the refresh control circuit 8 determines that the refresh operation is in a timeout state (step S2), the refresh control circuit 8 checks the refresh information stored in the memory circuits 5A–5D so as to determine whether or not all the memory banks 2A–2D have been refreshed (step S7).

When all the memory banks 2A–2D are determined to be refreshed at step S7, the refresh control circuit 8 outputs a signal for incrementing the refresh counter 4 (step S10), and the procedure returns to step S2 so as to determine whether or not the refresh operation is in a timeout state again.

When any unrefreshed memory bank or banks is/are determined to be present at step S7, the refresh control circuit 8 refreshes the unrefreshed memory bank or banks (step S8) and controls the operation so as to cause the memory circuit corresponding to the memory bank on which the refresh operation is performed to store refresh information which indicates that the memory bank has been refreshed (step S9). After the refresh operation (steps S7–S9) is performed with respect to unrefreshed memory banks among the memory banks 2A–2D (step S7), the refresh control circuit 8 outputs an increment signal to the refresh counter 4 (step S10) so as to perform a refresh operation with respect to the memory cells at the next address. This procedure is repeated until all the memory cells are refreshed.

Since reading/writing access supplies the memory cells with charge, an effect equivalent to that of a refresh operation is caused for the memory cells at a row address where the reading/writing access is performed. That is, in the case where normal access is performed with respect to a memory cell at an address in a memory bank, when a row address part in the accessed address is identical to an address output by the refresh counter (the refresh address originally consists of a row address part), the memory bank is considered as having been refreshed. Therefore, as in the case where the memory bank is refreshed in accordance with the control by the refresh control circuit 8, the memory circuits 5A–5D corresponding to their respective memory banks 2A–2D store refresh information which indicates that the corresponding one of the memory banks 2A–2D has been refreshed. This shortens the period of time for an access to be inhibited due to the refresh operation.

As described above, according to the present invention, the number of the plurality of memory banks 2A–2D is greater than the number of the memory banks used in the conventional control method, i.e., the number of the plurality of memory banks 2A–2D is greater than the number of the memory banks usually used, so as not to be simultaneously accessed. However, unlike the conventional control method, a plurality of refresh timers corresponding to the number of divided memory banks and the timer comparison section for comparing values of the refresh timers are not included in the semiconductor memory device 1 of the present invention. Instead of including the plurality of refresh timers and the timer comparison section, the semiconductor memory device 1 includes: a single refresh timer 3; memory circuits 5A–5D each having a size of substantially one bit and storing information which indicates whether or not a corresponding memory bank is refreshed; and adjustment circuits 6A–6D each performing switchover for selecting addresses where the refresh operation or normal access are performed with respect to the corresponding memory banks 2A–2D. Therefore, even when the memory block 2 is divided into a plurality of memory banks 2A–2D, there is no adverse effect as associated with the conventional control method, which includes a considerable increase in size of an internal circuit due to a plurality of refresh timers, and a considerable increase in size and complexity of the timer comparison section. Further, a size of the internal circuit of the semiconductor memory device 1 is reduced as compared to the conventional memory control device, so that an entire size of the semiconductor memory device 1 is not increased. That is, a semiconductor chip used for the semiconductor memory device 1 according to the present invention causes substantially no disadvantage with respect to a surface area or size thereof. Therefore, it is possible to easily divide the memory block 2 into a number of memory banks 2A–2D, considerably reduce the frequency of outputting the timeout signal from the refresh timer to the refresh control circuit 8, and reduce consumption current required for the refresh operation without increasing an entire size of the semiconductor memory device 1.

Further, the semiconductor memory device 1 according to the present invention includes the memory circuits 5A–5D corresponding to the respective memory banks 2A–2D which store historical information (refresh information) which indicates whether or not the corresponding memory banks 2A–2D have been refreshed. Therefore, even if the reading/writing access is frequently requested with respect to any one of the memory banks 2A–2D, the memory banks which have been already refreshed are not refreshed again as conventionally required, and therefore unnecessary refresh operations are avoided. This leads to further reduction in consumption current for the refresh operation.

As described above, according to the present invention, it is possible to reduce the frequency of outputting a timeout signal used for inhibiting a memory access and performing the refresh operation and consumption current required for the refresh operation. Therefore, it is possible to shorten an access inhibition period due to the refresh operation in the DRAM/PSRAM as compared to the DRAM/PSRAM in which the conventional and typical refresh operation is performed, thereby improving efficiency of an operation in a system including the semiconductor memory device of the present invention.

Figure 7:
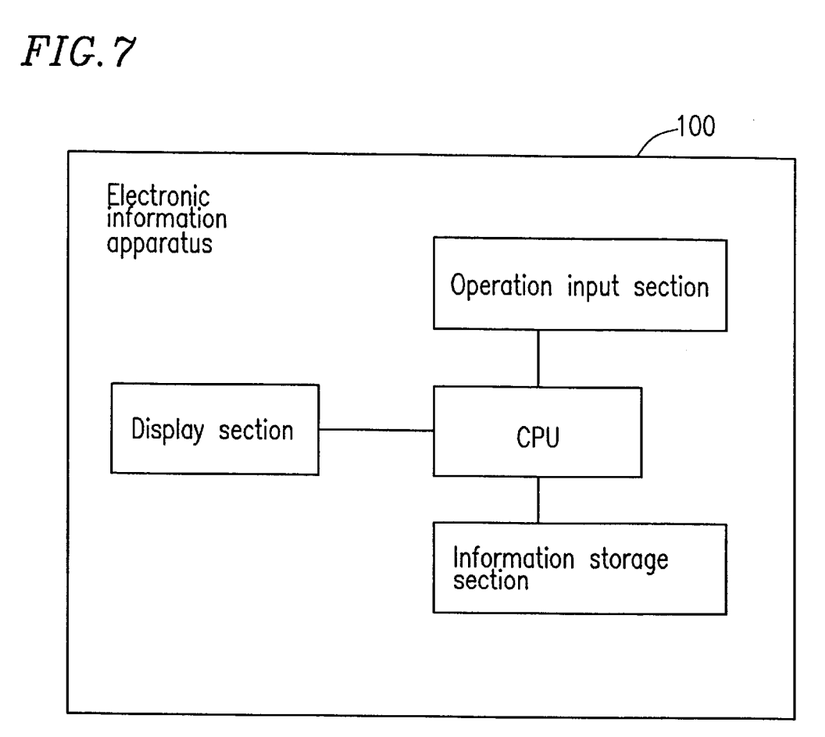
FIG. 7 is a block diagram showing a basic structure of an electronic information apparatus to which the semiconductor memory device of the present invention is applied.

It should be noted that the semiconductor memory device 1 according to the present invention can be easily incorporated into an electronic information device, such as a mobile phone or a computer, thereby achieving the effects of the present invention. For example, as shown in FIG. 7, in the case where there is provided an electronic information apparatus 100 which includes: an information storage section such as a RAM (PSRAM, DRAM or the like) or ROM (a flash memory or the like); an operation input section; a display section, such as a liquid crystal display device, which displays a startup screen, results of information processing, etc.; and a CPU (Central Processing Unit) which receives a control command from the operation input means and processes information (e.g., video data, audio data, etc.) based on a prescribed information processing program and data associated with the information processing program whilst performing information reading and writing processes (memory operations) and a refresh operation on the information storage means, the semiconductor memory device having a refresh control function according to the present invention can be easily incorporated into the electronic information apparatus 100 as the information storage section (a PSRAM or DRAM).

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a memory block including a plurality of memory cells each including a transistor and a capacitor and storing information based on the presence of charges in the capacitor, the charges in the capacitor being held by a refresh operation, the memory block being divided into a plurality of memory banks such that the number of the memory banks is greater than a usually-prescribed number and the plurality of memory banks are not simultaneously accessed, the plurality of memory banks individually receiving access and refresh operations with respect to the memory cells;
   a time measurement section for measuring a critical amount of time for the memory cells to hold data;
   a plurality of memory circuits each storing refresh information which indicates that a corresponding memory bank is refreshed;
   a refresh address designation section for designating a refresh address in the corresponding memory bank; and
   a refresh control section for controlling the refresh operation with respect to each of the memory banks according to the designated refresh address and determining an unrefreshed memory bank based on the refresh information so as to perform the refresh operation with respect to the determined unrefreshed memory bank.

2. A semiconductor memory device according to claim 1, further comprising a plurality of adjustment sections provided so as to respectively correspond to the memory banks and select any one of the refresh address and a normal access address based on a control signal from the refresh control section.

3. A semiconductor memory device according to claim 2, wherein the refresh control section controls an operation of the semiconductor memory device so as to inhibit access to a normal access address and prioritize the refresh operation with respect to the memory bank which is not refreshed within the critical amount of time for the memory cells to hold data.

4. A semiconductor memory device according to claim 3, wherein when normal access is performed with respect to the memory bank at a normal access address, the refresh control section controls the operation of the semiconductor memory device so as to simultaneously perform the refresh operation at the refresh address with respect to the plurality of memory banks except for the memory bank normally accessed at the normal access address.

5. A semiconductor memory device according to claim 2, wherein when normal access is performed with respect to the memory bank at a normal access address, the refresh control section controls the operation of the semiconductor memory device so as to simultaneously perform the refresh operation at the refresh address with respect to the plurality of memory banks except for the memory bank normally accessed at the normal access address.

6. A semiconductor memory device according to claim 1, wherein the refresh control section controls a operation of the semiconductor memory device so as to inhibit access to a normal access address and prioritize the refresh operation with respect to the memory bank which is not refreshed within the critical amount of time for the memory cells to hold data.

7. A semiconductor memory device according to claim 6, wherein when normal access is performed with respect to the memory bank at a normal access address, the refresh control section controls the operation of the semiconductor memory device so as to simultaneously perform the refresh operation at the refresh address with respect to the plurality of memory banks except for the memory bank normally accessed at the normal access address.

8. A semiconductor memory device according to claim 1, wherein when normal access is performed with respect to the memory bank at a normal access address, the refresh control section controls the operation of the semiconductor memory device so as to simultaneously perform the refresh operation at the refresh address with respect to the plurality of memory banks except for the memory bank normally accessed at the normal access address.

9. A method for controlling a semiconductor memory device, comprising the steps of:
   when normal access for a read/write operation is performed with respect to a memory bank in the semiconductor memory device due to an external control signal, checking refresh information stored in all memory circuits corresponding to their respective memory banks other than the memory circuit corresponding to the accessed memory bank so as to determine whether or not there is any unrefreshed memory banks other than for the accessed memory bank;
   when an unrefreshed memory bank is determined to be present based on the refresh information, refreshing the unrefreshed memory bank simultaneously with the normal access for a read/write operation to the other memory bank and storing refresh information which indicates that the unrefreshed memory bank has been refreshed;
   when a time measurement section outputs a timeout signal which indicates that a critical amount of time for memory cells to hold data has elapsed, checking the refresh information stored in the memory circuits corresponding to all the memory banks so as to determine whether or not all the memory banks have been refreshed;
   when an unrefreshed memory bank is determined to be present, refreshing the unrefreshed memory bank and storing the refresh information which indicates that the unrefreshed memory bank has been refreshed in the memory circuit corresponding to the unrefreshed memory bank;
   checking the refresh information stored in the memory circuits corresponding to all the memory banks once again so as to determine whether or not there is any memory bank which is left unrefreshed;
   when an unrefreshed memory bank is determined to be present based on the refresh information, refreshing the unrefreshed memory bank;
   repeating the checking and refresh operations until all the memory banks are refreshed; and
   incrementing a refresh address designation section for designating a refresh address at the time of performing the refresh operation after all the memory banks have been refreshed, wherein when all the memory banks have been refreshed before outputting the timeout signal, the refresh address designation section is incremented immediately after outputting the timeout signal.

10. A method for controlling a semiconductor memory device according to claim 9, wherein when normal access for a read/write operation is performed with respect to the memory bank in the semiconductor memory device due to the external control signal and/or when the timeout signal is output, the refresh operation is performed with respect to groups of the plurality of memory banks each group consisting of two or more memory banks.

11. A method for controlling a semiconductor memory device according to claim 10, wherein after the timeout signal is output, the refresh operation is performed with respect to an unrefreshed memory bank while inhibiting an access of the external control signal to the memory banks.

12. A method for controlling a semiconductor memory device according to claim 11, wherein in the memory bank targeted for normal access for a read/write operation due to the application of the external control signal, when a row address part obtained by decoding an address of a memory cell receiving the normal access is identical to a row address output by the refresh address designation section, the refresh information, which indicates that the memory bank targeted for the normal access has been refreshed, is stored in the memory circuit corresponding to the memory bank targeted for the normal access.

13. A method for controlling a semiconductor memory device according to claim 10, wherein in the memory bank targeted for normal access for a read/write operation due to the application of the external control signal, when a row address part obtained by decoding an address of a memory cell receiving the normal access is identical to a row address output by the refresh address designation section, the refresh information, which indicates that the memory bank targeted for the normal access has been refreshed, is stored in the memory circuit corresponding to the memory bank targeted for the normal access.

14. A method for controlling a semiconductor memory device according to claim 9, wherein after the timeout signal is output, the refresh operation is performed with respect to an unrefreshed memory bank while inhibiting an access of the external control signal to the memory banks.

15. A method for controlling a semiconductor memory device according to claim 14, wherein in the memory bank targeted for normal access for a read/write operation due to the application of the external control signal, when a row address part obtained by decoding an address of a memory cell receiving the normal access is identical to a row address output by the refresh address designation section, the refresh information, which indicates that the memory bank targeted for the normal access has been refreshed, is stored in the memory circuit corresponding to the memory bank targeted for the normal access.

16. A method for controlling a semiconductor memory device according to claim 9, wherein in the memory bank targeted for normal access for a read/write operation due to the application of the external control signal, when a row address part obtained by decoding an address of a memory cell receiving the normal access is identical to a row address output by the refresh address designation section, the refresh information, which indicates that the memory bank targeted for the normal access has been refreshed, is stored in the memory circuit corresponding to the memory bank targeted for the normal access.

17. An electronic information apparatus for processing information while performing memory and refresh operations, the apparatus comprising:
a semiconductor memory device having:
a memory block including a plurality of memory cells each including a transistor and a capacitor and storing information based on the presence of charges in the capacitor, the charges in the capacitor being held by a refresh operation, the memory block being divided into a plurality of memory banks such that the number of the memory banks is greater than a usually-prescribed number and the plurality of memory banks are not simultaneously accessed, the plurality of memory banks individually receiving access and refresh operations with respect to the memory cells;
a time measurement section for measuring a critical amount of time for the memory cells to hold data;
a plurality of memory circuits each storing refresh information which indicates that a corresponding memory bank is refreshed;
a refresh address designation section for designating a refresh address in the corresponding memory bank; and
a refresh control section for controlling the refresh operation with respect to each of the memory banks according to the designated refresh address and determining an unrefreshed memory bank based on the refresh information so as to perform the refresh operation with respect to the determined unrefreshed memory bank.

* * * * *